US008643188B2

(12) United States Patent
Stolze et al.

(10) Patent No.: US 8,643,188 B2
(45) Date of Patent: Feb. 4, 2014

(54) CONNECTING SYSTEM FOR ELECTRICALLY CONNECTING ELECTRONIC DEVICES AND METHOD FOR CONNECTING AN ELECTRICALLY CONDUCTIVE FIRST CONNECTOR AND ELECTRICALLY CONDUCTIVE SECOND CONNECTOR

(75) Inventors: Thilo Stolze, Arnsberg (DE); Olaf Kirsch, Erwitte (DE)

(73) Assignee: Infineon Technologies AG, Neubiberg (DE)

( * ) Notice: Subject to any disclaimer, the term of this patent is extended or adjusted under 35 U.S.C. 154(b) by 57 days.

(21) Appl. No.: 13/152,338

(22) Filed: Jun. 3, 2011

(65) Prior Publication Data

US 2012/0306091 A1  Dec. 6, 2012

(51) Int. Cl.
*H01L 23/48* (2006.01)

(52) U.S. Cl.
USPC ........... 257/773; 257/735; 257/783; 257/784; 257/785; 361/785; 361/786; 361/787; 361/788; 361/789; 361/790; 361/791

(58) Field of Classification Search
None
See application file for complete search history.

(56) References Cited

U.S. PATENT DOCUMENTS

| 3,912,984 | A | * | 10/1975 | Lockhart et al. ............ 361/783 |
| 4,763,188 | A | * | 8/1988 | Johnson ...................... 257/777 |
| 5,910,885 | A | * | 6/1999 | Gulachenski et al. ....... 361/774 |
| 2004/0066638 | A1 | | 4/2004 | Streltsov |
| 2010/0165582 | A1 | | 7/2010 | Hornkamp |

FOREIGN PATENT DOCUMENTS

| DE | 102008012570 A1 | 9/2009 |
| DE | 102004036982 B4 | 7/2010 |

* cited by examiner

*Primary Examiner* — Steven Loke
*Assistant Examiner* — Cuong B Nguyen
(74) *Attorney, Agent, or Firm* — Murphy, Bilak & Homiller, PLLC

(57) ABSTRACT

A semiconductor module system includes a substrate, at least one semiconductor chip, and a number of at least two electrically conductive first connecting elements. The substrate has a bottom side and a top side spaced apart from the bottom side in a vertical direction. The at least one semiconductor chip is arranged on the top side. Each one of the first connecting elements has a first end which protrudes away from an insulation carrier of the substrate in a direction perpendicular to the vertical direction. The semiconductor system further includes a connecting system with a number of N≥1 connectors. A first one of the connectors includes at least two electrically conductive second connecting elements. Each one of the second connecting elements has a first end. The first end of each one of the first connecting elements is electrically conductively connectable to the first end of one of the second connecting elements.

24 Claims, 5 Drawing Sheets

CONNECTING SYSTEM FOR ELECTRICALLY CONNECTING ELECTRONIC DEVICES AND METHOD FOR CONNECTING AN ELECTRICALLY CONDUCTIVE FIRST CONNECTOR AND ELECTRICALLY CONDUCTIVE SECOND CONNECTOR

FIELD OF THE INVENTION

The present application relates to semiconductor modules.

BACKGROUND

For many electric connections between electric connectors of electronic units as used, for example, in power electronics circuitry, the electric connectors are required to have a low electrical resistance, a high ampacity, and to a allow for a quick and simple connection and disconnection. Therefore, there is a need for an improved connecting system, and for an improved electrical connector method.

SUMMARY

According to one aspect, a semiconductor module system includes a substrate, at least one semiconductor chip, and a number of at least two electrically conductive first connecting elements. The substrate has a bottom side and a top side spaced apart from the bottom side in a vertical direction. The at least one semiconductor chip is arranged on the top side. Each one of the first connecting elements has a first end which protrudes away from an insulation carrier of the substrate in a direction perpendicular to the vertical direction. The semiconductor system further includes a connecting system with a number of N≥1 connectors. A first one of the connectors includes at least two electrically conductive second connecting elements. Each one of the second connecting elements has a first end. The first end of each one of the first connecting elements is electrically conductively connectable to the first end of one of the second connecting elements.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "leading", "trailing", etc., is used with reference to the orientation of the FIGs being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1A:
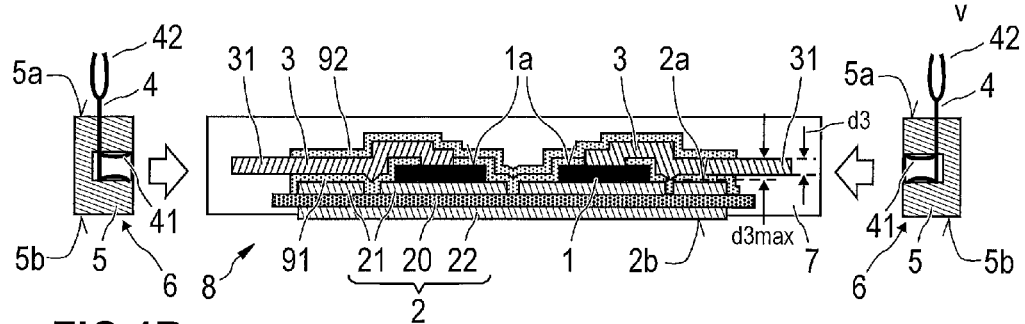
FIG. 1A is a cross-sectional view of a power semiconductor module system with connectors.
Figure 1B:
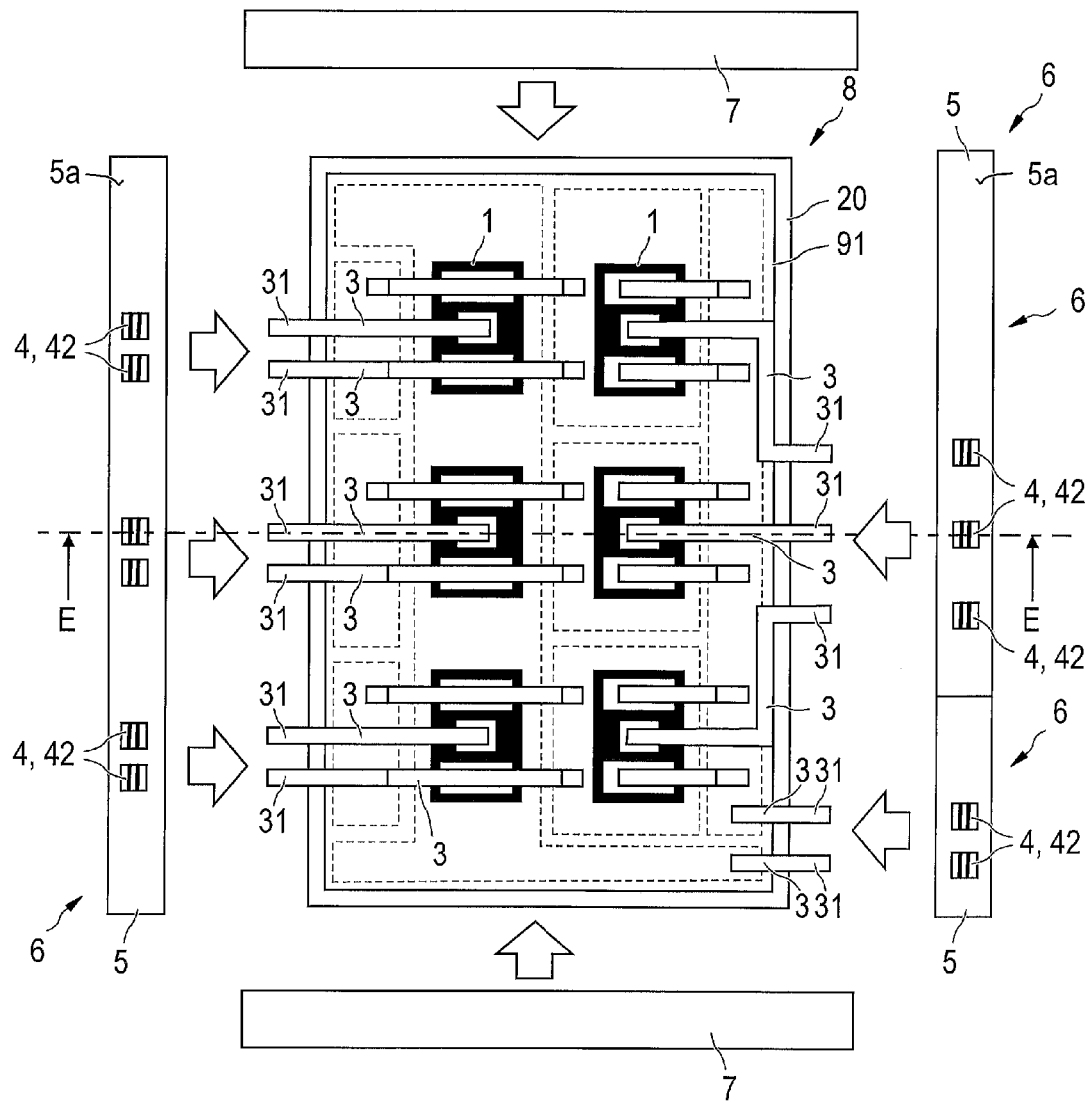
FIG. 1B is a top view of the power semiconductor module system of FIG. 1A.

Referring now to FIG. 1A there is illustrated a power semiconductor module system in cross-section, and FIG. 1B is a top view of the power semiconductor module. The cross-section of FIG. 1A is taken in a plane E-E shown in FIG. 1B. The power semiconductor module system includes a substrate arrangement 8, and a number of N≥1 connectors 6 which serve to electrically connect the substrate arrangement 8. The substrate arrangement 8 includes a substrate 2 with an insulation carrier 20, an optional top metallization layer 21, and an optional bottom metallization layer 22. The insulation carrier 20 electrically insulates the top metallization layer 21 from the bottom metallization layer 22.

In order to allow for a sufficient cooling of the power semiconductor chips 1, a low heat transmission resistance is an important property of the insulation carrier 20. Hence, the material and the thickness of the insulation carrier 20 needs to be adapted to the requirements of the power semiconductor module. For example, the insulation carrier 20 may be a ceramic so that the substrate 2 forms a ceramic substrate. For instance, the insulation carrier 20 may include or consist of one of the following materials: aluminum oxide ($Al_2O_3$); aluminum nitride (AlN); silicon nitride ($Si_3N_4$). Then, for instance, the thickness of one, some or all of such insulation carriers 20 may range from 0.2 mm to 2 mm. In some embodiments, at least one of the substrates 2 may be a direct copper bonding substrate (DCB substrate), or a direct aluminum bonding substrate (DAB substrate), or an active metal brazing substrate (AMB substrate).

The substrate 2 has a bottom side 2b, and a top side 2a which is spaced apart from the bottom side 2b in a vertical direction v. At least one semiconductor chip 1, for instance a MOSFET (metal oxide semicondcutor field effect transistor), an IGBT (insualted gate bipolar transsitor), a J-FET (junction field effect transistor), a diode, or a thyristor, is arranged on the top side 2a of the substrate 2.

The substrate arrangement 8 further includes a number of at least two electrically conductive first connecting elements 3 which serve to electrically connect the substrate arrangement 8. Each one of the first connecting elements 3 may have a first end 31 at which the respective connecting element 3 protrudes away from the insulation carrier 20 in a direction perpendicular to the vertical direction v. In order to electrically insulate one, some or all connecting elements 3 from the top metallization layer 21, a first insulation layer 91 may be provided between the top metallization layer 21 and the first connecting elements 3 to be insulated. Optionally, a second insulation layer 92 may be provided on that side of the first connecting elements 3 facing away from the substrate 2. In FIG. 1B, the second metallization layer 92 is removed and the outline of the top metallization layer 21 is indicated by dashed lines.

A first one of the connectors 6 includes at least two electrically conductive second connecting elements 4. Each one of the second connecting elements 4 has a first end 41 and a second end 42. Each one of the first connecting elements 3 is electrically conductively connectable at its first end 31 to a corresponding first end 41 of one of the second connecting elements 4. As can be seen in FIG. 1B, in a connector 6 two or more second connecting elements 4 may be fastend in a common mounting 5, for instance a dielectric mounting, e.g. a plastic mounting. For fastening one, two or more second connecting elements 4 in a mounting 5, the respective second connecting elements 4 may be inserted in a precast mounting 5 and/or molded into the mounting 5.

The connectors 6 serve to allow for an easy electrical connectability of the substrate arrangement 8 to an external device, for instance a strip line. In the assembled state of the power semiconductor module, the external electrical connection of the power semiconductor module is realized by the second ends 42 of the second connecting elements 4. For this, in the assembled state of the power semiconductor module the second ends 42 of the second connecting elements 4 are accessible from outside the power semiconductor module. For instance, the second end 42 of one, two, more than two or all second connecting elements 4 may be accessible at an upper side 5a of the respective mounting 5, whereby the upper side 5a is spaced distant from a lower side 5b of the mounting 5 in the vertical direction v. For instance, the second end 42 of one, two, more than two or all second connecting elements 4 may protrude away from the respective mounting 5 at its upper side 5a. Even though the second ends 42 are designed as bifurcated press-fit connectors, other designs like solder contacts, screw contacts, etc., are also possible.

In order to electrically connect all second connecting elements 4 of a connector 6 to the substrate arrangement 8, the respective connector 6 may be pushed toward the substrate arrangement 8 in a direction perpendicular to the vertical direction v as is indicated in FIGS. 1A and 1B by arrows such that the first end 41 of each one of the second connecting elements 4 makes electrical contact with a corresponding first end 31 of one of the first connecting elements 3. Thereby, one, two, more than two or each connection between a first end 41 of a second connecting element 4 of a connector 6 and a corresponding first end 31 of a first connecting element 3 may be a plug-and-socket connection. For instance, each one of the first ends 41 of the second connecting elements 4 of a connector 6 may be formed as a socket which is suitable to receive the corresponding first end 31 of one of the first connecting elements 3. Correspondingly, each one of the first ends 31 of the first connecting elements 3 may be formed as a plug.

According to one embodiment, the first connecting elements 3 may be formed as or from a metallization layer. For instance, such a metallization layer may have, in the vertical direction v, a thickness d3 having, with regard to the respective first connecting element 3, an average thickness d3 of more than 50 μm and/or of less than 200 μm. Then, such a metallization layer may have, in the vertical direction v, an maximum thickness d3max of less than 600 μm. In order to achieve a low electrical resistance, the first connecting elements 3 may be formed of copper or of an alloy with at least 90 weight % copper.

The substrate arrangement 8 may be produced on the basis of PLIT technology (PLIT=Power Layer Interconnect Technology). For this, in a first step, the substrate 2 may be provided and equipped with at least one power semiconductor chip 1. Then, the first insulation layer 91 which is formed as a continuous layer may be deposited in a second step on the sides of the substrate 2 and the power semiconductor chips 1 facing away from the bottom side 2b of the substrate 2, and, in a subsequent third step, be patterned so as to achieve the first insulation layer 91. The first insulation layer 91 has openings or cut-outs above the top sides 1a of the power semiconductor chips 1 and above certain sections of the top metallization layer 21 such that top side contacts of the power semiconductor chips 1 and the top metallization layer 21 are accessible through the openings and/or the cut-outs. Then, in a subsequent fourth step, a metal layer may be arranged over the first insulation layer 91 so as to produce the first connecting elements 3. The metal layer may be prefabricated as a structured metal sheet (e.g. a lead frame) or as a continuous metal sheet, or be deposited, for instance, in a structured or continuos manner, as a deposition layer over the first insulation layer 91 and the openings or cut-outs. For instance, a deposition layer may be produced in a deposition process, for instance a PVD (physical vapor deposition) or CVD (chemical vapor deposition) process. The first connecting elements 3 may also be prefabricated as single parts and mounted at the respective target positions. In case the metal layer is produced in a deposition process, and a carrier is provided prior to the the deposition process. The carrier allows for a deposition of the material that forms the first ends 31 and supports the first ends 31 at the bottom side of the metal layer to be produced, i.e., at that side of the metal layer facing toward the substrate 2. After the deposition process is finished, the carrier is removed at least partly so as to free the first ends 31 of carrier material. For instance, the part to be removed may be punched and dismanteled. Such a dismanteling process can be facilitated by using a material for the carrier which does not have a strong anderence on the material of the first connecting elements 3. A further possibility for removing the carrier is to selectively etch the carrier against the deposited metal layer and the substrate 2. The step of removing the carrier at least partly may take place prior or after a fifth step, in which the second insulation layer 92 is deposited over the first connecting elements 3.

Instead of providing and subsequently patterning a continuos layer, a patterned layer may be directly produced in a patterned manner, for instance by a printing technology, or by providing and attaching prefabricated elements to the layer(s) underneath. For instance, the first connecting elements 3 may provided as metal stripes and soldered or electrically conductively adhered to the top sides 1a of the respective power semiconductor chips 1 and/or to the respective sections of the top metallization layer 21, that is, in the areas of the openings or cut-outs in the first insulation layer 91.

Figure 2A:
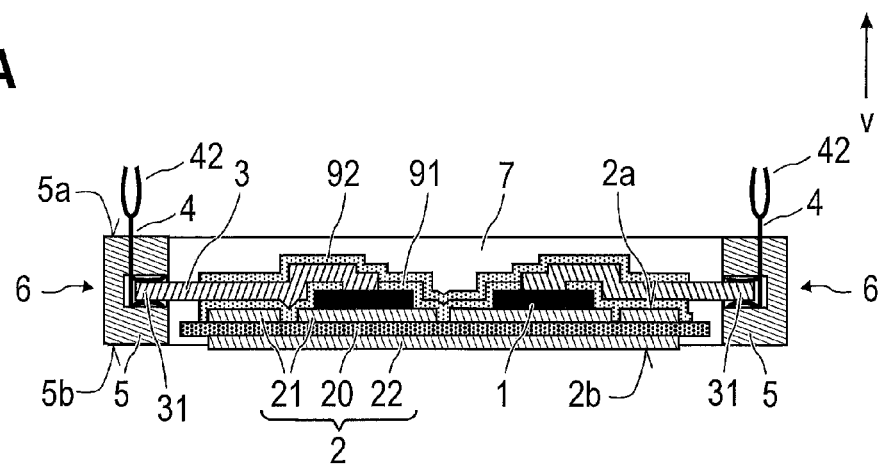
FIG. 2A is a cross-sectional view of a power semiconductor module formed from the power semiconductor module system of FIG. 1A.

Referring now to FIG. 2A there is illustrated the power semiconductor module system of FIGS. 1A and 1B in the assembled state, that is, with all connectors 6 electrically connected to the first connecting elements 3 of the substrate arrangement 8. In the assembled state, the at least one semiconductor chip 1 and the substrate arrangement 2 may be surrounded by a frame. In the embodiment of FIGS. 1A, 1B, 2A, 2B, the frame is partly formed from the connectors 6 in combination with at least one bridge element 7. Such bridge elements 7 serve to complete the frame. For instance, the bridge elements 7 may be made of the same material as the mounting 5. In other embodiments, a frame may be assembled from the connectors 6 only, whereby each connector 6 is equipped with at least one second connecting element 4. In order to form a stable, self-supporting frame, the frame elements, that is, all connectors 6 and all bridge elements 7, may be directly connected to one another by a suitable bonding method, e.g. by adhereing, screwing or clicking adjacent ones of the frame elements directly together.

Figure 2B:
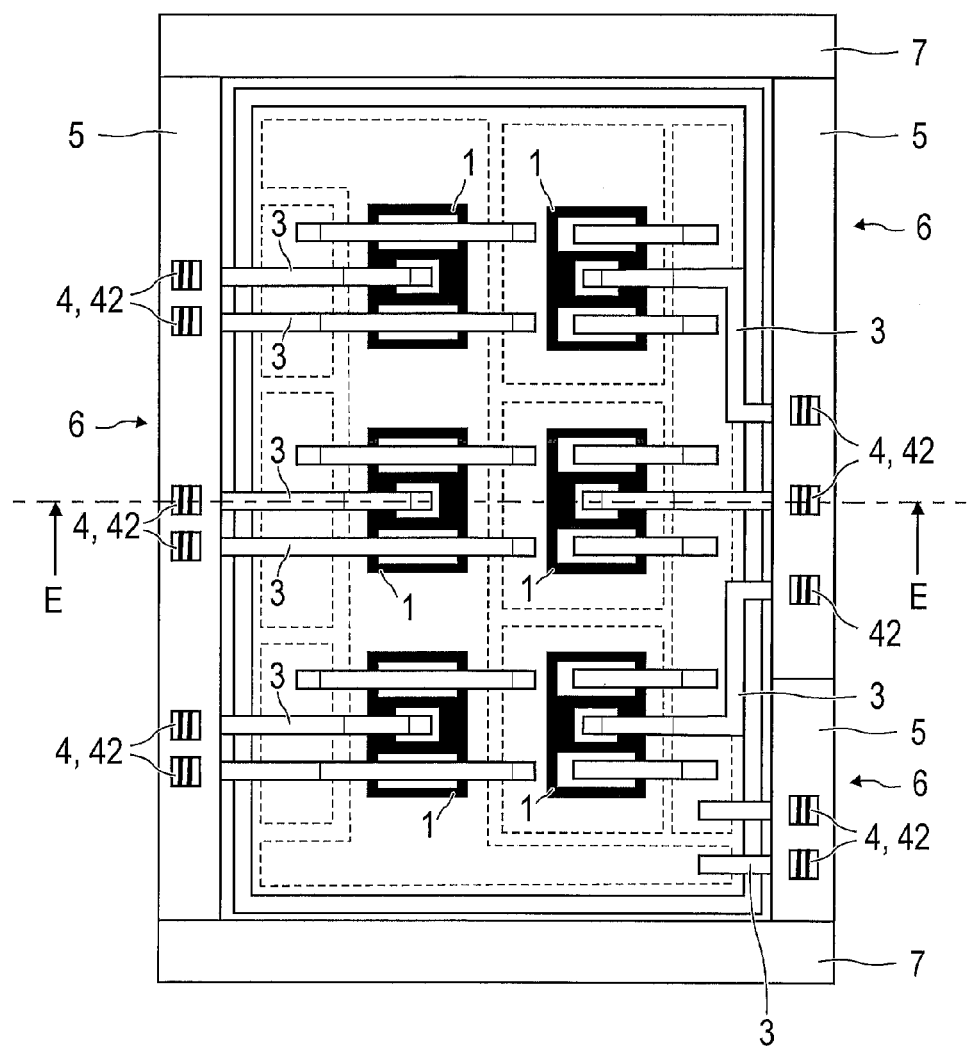
FIG. 2B is a top view of the power semiconductor module of FIG. 2A.
Figure 3:
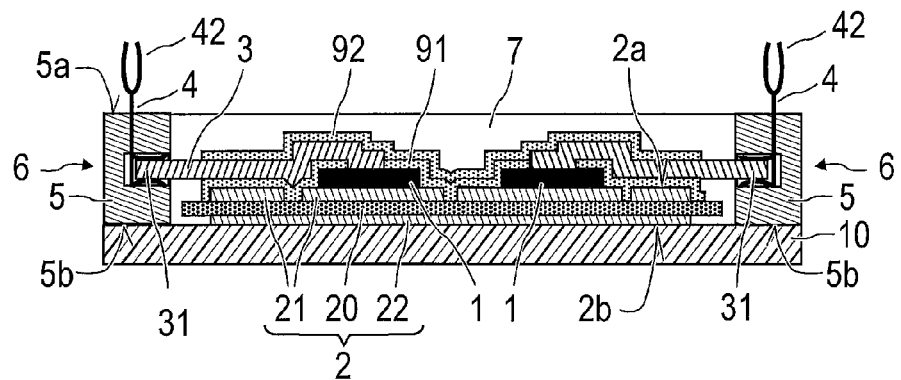
FIG. 3 is a cross-sectional view of a power semiconductor module with a solid base plate.

Referring now to FIG. 3 there is illustrated a power semiconductor module which differs from the power semiconductor module of FIGS. 2A and 2B in that the module additionally includes a solid base plate 10. The base plate 10 may range from 0.1 mm to 20 mm thick and has a low thermal resistance so as to allow for the dissipation of waste heat produced by the at least one power semiconductor chip 1 toward a heat sink (not shown) which may be attached to the side of the base plate 10 facing away from the at least one power semiconductor chip 1. For example, the base plate 10 may be made of metal, e.g. of copper or aluminum, or of an alloy with at least one of copper or aluminum. In other embodiments, the base plate 10 may be made of an MMC material (MMC=metal matrix composite). The base plate 10 may be mechanically bonded to the bottom side 2b of the substrate 2 by soldering, sintering or gluing. The process of bonding the base plate 10 to the substrate 2 may take place prior to or after the connectors 6 are connected to the substrate arrangement 8.

Figure 4:
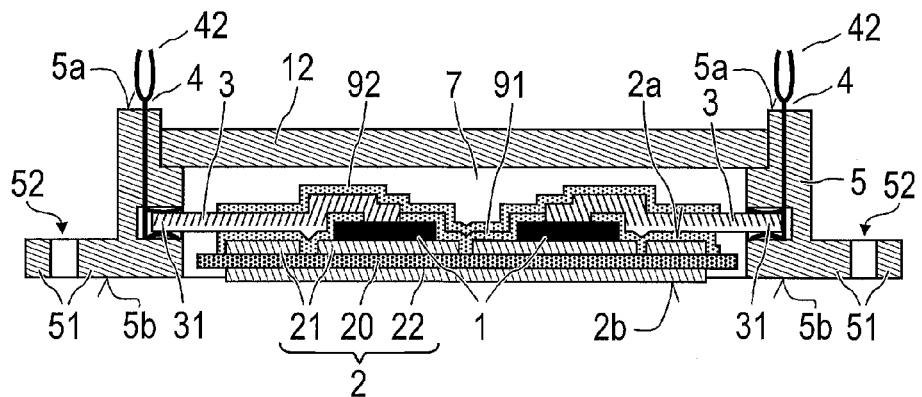
FIG. 4 is a cross-sectional view of a power semiconductor module with connectors having assembly openings.

FIG. 4 shows a power semiconductor module which differs from the power semiconductor module of FIG. 2A in that the mountings 5 of the connectors 6 are equipped with optional mounting flanges 51. Such a mounting flange 51 may further include a mounting opening 52 for inserting a screw or another mounting implement. Alternatively or in addition, a bridge element 7 may be equipped with a mouting flange that optionally includes a mounting opening.

A further difference to the power semiconductor module of FIG. 2A is that an optional cover plate 12 is arranged on that side of the substrate arrangement 8 facing away from the bottom side 2b of the substrate 2.

Figure 5:
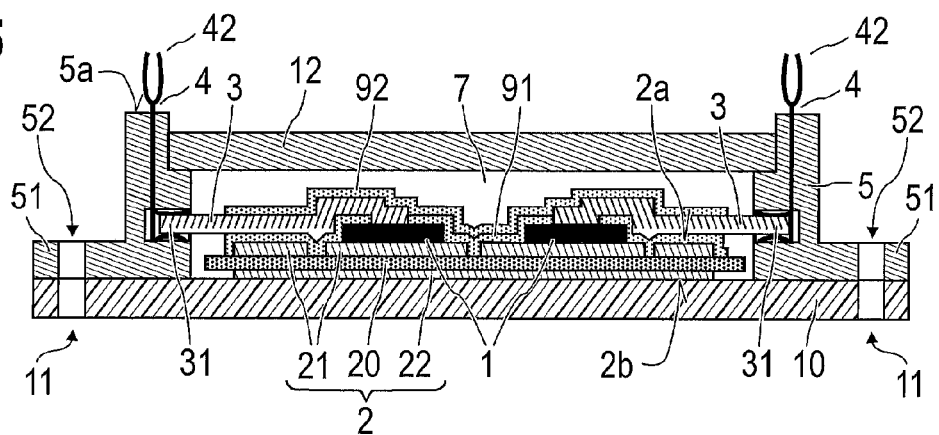
FIG. 5 is a cross-sectional view of a power semiconductor module which has a solid base plate.

Compared with the power semiconductor module of FIG. 4, the power semiconductor module illustrated in FIG. 5 additionally has a base plate 10. The base plate 10 may be made of the same materials, may have the same thickness and may be bonded to the substrate 2 in the same way as the base plate 10 of the power semiconductor module of FIG. 3. As shown in FIG. 5, the base plate 10 may have optional mounting openings 11. In the embodiment of FIG. 5, the mounting openings 11 are aligned with the mounting openings 52 of the flanges 51.

Figure 6:
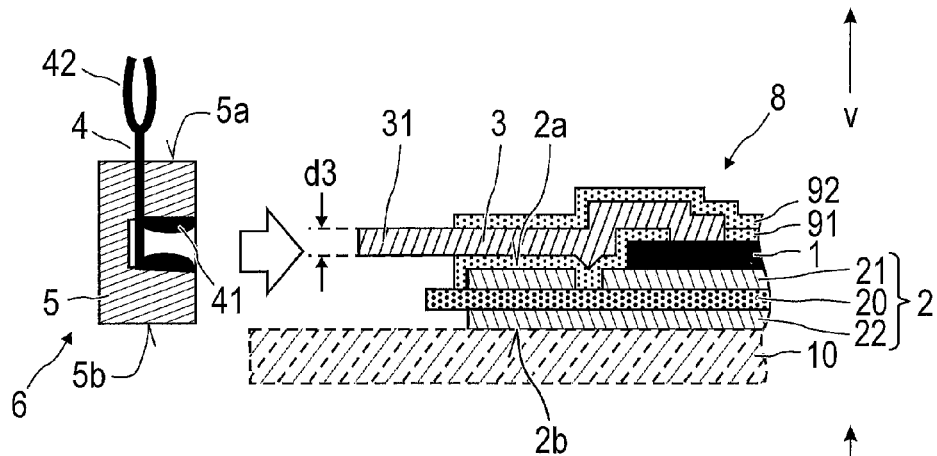
FIG. 6 is a cross-sectional view of a section of a power semiconductor module system with a connector that includes a press-fit contact.

Referring now to FIG. 6 there is illustrated a section of a power semiconductor module system that is construed for a power semiconductor module with a press-fit connection between the first ends 31 of the first connecting elements 3 and the first ends 41 of the second connecting elements 4. By inserting the first ends 31 of the first connecting elements 3 into a socket which is formed by the first ends 41 of the second connecting element 4 and by pressing the connector 6 in a direction perpendicular to the vertical direction v toward the substrate arrangement 8, the first ends 31 of the first connecting elements 3 are reliably held in the socket by a press-fit connection. Such a press-fit connection may be designed to form a cold or contact welded connection.

Figure 7:
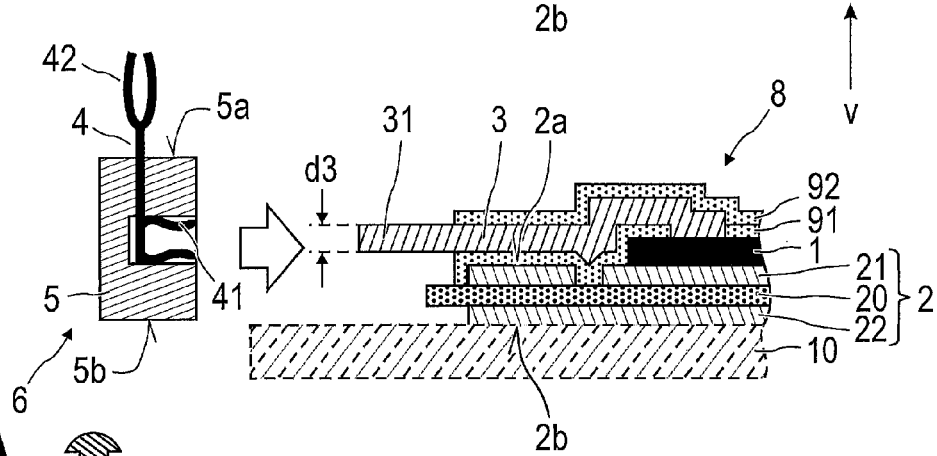
FIG. 7 is a cross-sectional view of a section of a power semiconductor module system with a connector that includes a spring contact.

The power semiconductor module system of FIG. 7 differs from the power semiconductor module system explained with reference to FIG. 6 in that the first end 41 of the second connecting element 42 is formed as a contact spring. After inserting the first end 31 of the first connecting element 3 into the connector 6, the contact spring is pretensioned, thereby establishing an intense electrical contact between the first and second connecting elements 3 and 4, respectively.

Figure 8A:
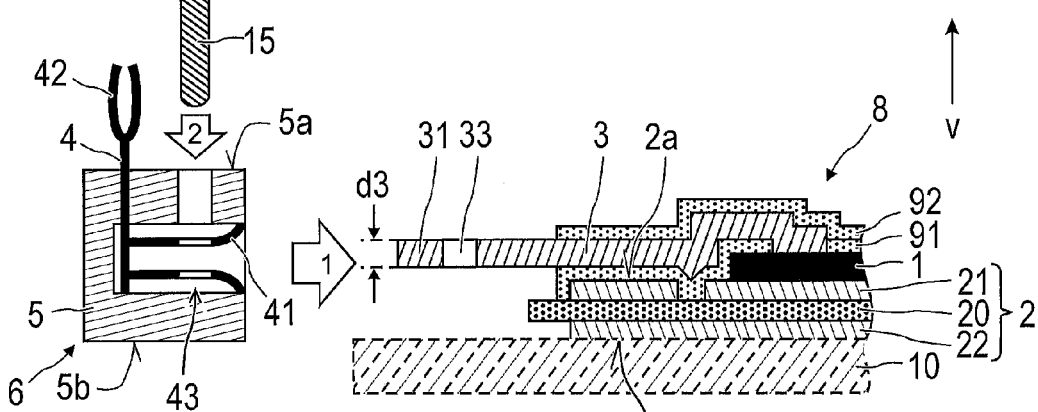
FIG. 8A is a cross-sectional view of a section of a power semiconductor module system with a connector that is to be connected to by means of a rivet connection.
Figure 8B:
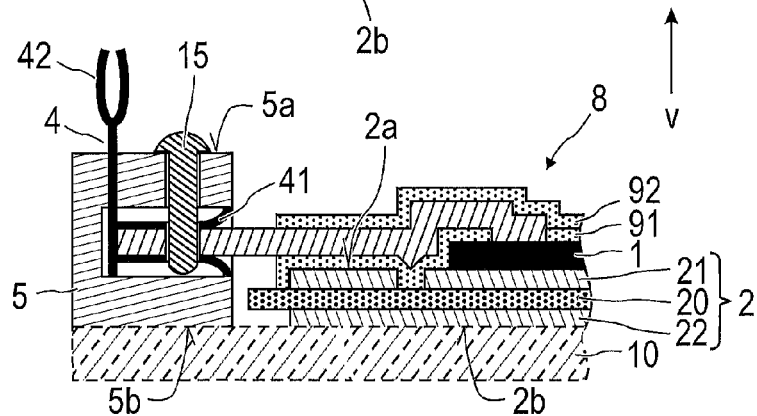
FIG. 8B is a cross-sectional view of the section of the power semiconductor module system of FIG. 8A after the rivet connection is completed.

In the embodiment of FIG. 8A, the first end 31 of the first connecting element 3 has a mounting hole 33 that aligns with a mounting hole 43 formed in the first end 41 of the corresponding second connecting element 4 after a first step (see arrow marked with "1") in which the first end 31 of the first connecting element 3 is inserted in the connector 6 and the connector 6 is pressed toward the substrate arrangement 8 perpendicular to the vertical direction v. In a following second step (see arrow marked with "2"), a locking bar or rivet 15 is inserted into both mounting holes 33 and 43. FIG. 8B shows the power semiconductor module after the locking bar 15 has been inserted.

In FIGS. 6, 7, 8A and 8B, an optional base plate 10 is shown by dashed lines. Such a base plate 10 may have the same features as the base plates 10 previously explained.

Figure 9A:
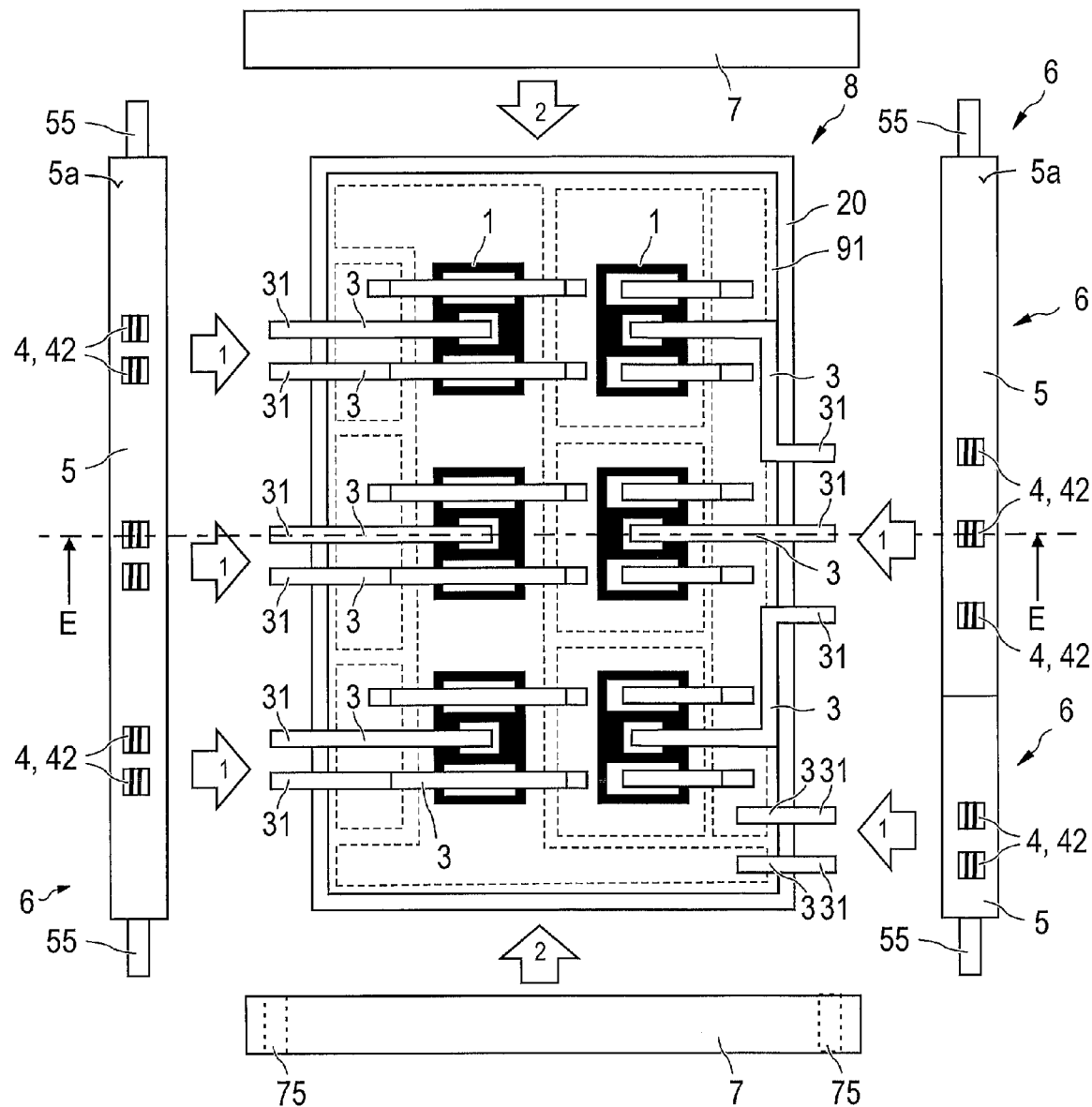
FIG. 9A is a top view of a power semiconductor module system with a frame which is composed of frame elements which are connected to one another by form-fitting connections.
Figure 9B:
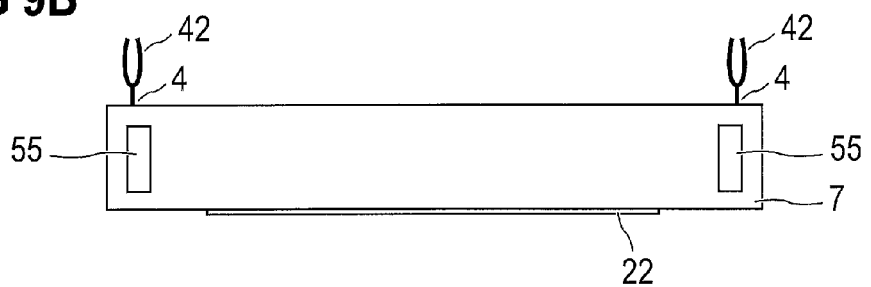
FIG. 9B is a side view of the power semiconductor module system of FIG. 9A.

Referring now to FIG. 9A there is illustrated a power semiconductor module system which differs from the power semiconductor module system of FIGS. 1A and 1B in that the frame elements, that is, the connectors 6 and the bridge elements 7 of the frame, are mechanically joined to one another such that the frame is self-supporting. In order to realize such a frame, adjacent ones of the frame elements 6, 7 may be joined to one another by a releasable or unreleasable locking connection, for instance a snapping or latching connection. In the embodiment of FIG. 9A, some of the frame elements 6, 7 have protrusions 55 which can be inserted in corresponding receving openings 75 in the bridge elements 7 which are hidden in FIG. 9A and therefore indicated by dashed lines. FIG. 9B is a side view of the assembled power semiconductor module.

As is apparent from the present embodiments, the first ends 31 of a substrate arrangement 8 may be arranged along opposite sides of the substrate 2.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor module system comprising:
a substrate having a bottom side and a top side spaced apart from the bottom side in a vertical direction;
at least one semiconductor chip arranged on the top side;
a number of at least two electrically conductive first connecting elements having a first end and a second end, wherein a first end of each one of the electrically conductive first connecting elements is freely accessible and protrudes away from an insulation carrier of the substrate in a direction perpendicular to the vertical direction;
a connecting system comprising a number of N≥1 connectors;
wherein one of the N connectors comprises at least two electrically conductive second connecting elements, each one of the electrically conductive second connecting elements having a first end and a second end;
wherein the second end of one of the electrically conductive second connecting elements is electrically conductively connectable to an external device; and
wherein the first end of each one of the electrically conductive first connecting elements is electrically conductively connectable to the first end of one of the electrically conductive second connecting elements.

2. The semiconductor module system as claimed in claim 1, wherein the first end of each one of the electrically conductive first connecting elements is electrically conductively connectable to the first end of one of the electrically conductive second connecting elements by a plug-and-socket connection.

3. The semiconductor module system as claimed in claim 1, wherein each one of the electrically conductive first connecting elements is formed as metallization layer having, in the vertical direction, an average thickness of less than 200 μm.

4. The semiconductor module system as claimed in claim 1, wherein each one of the electrically conductive first connecting elements is formed as metallization layer having, in the vertical direction, a maximum thickness of less than 600 μm.

5. The semiconductor module system as claimed in claim 1, wherein each one of the first ends of the electrically conductive second connecting elements is formed as a socket configured to receive the first end of one of the electrically conductive first connecting elements.

6. The semiconductor module system as claimed in claim 1, wherein each one of the first ends of the electrically conductive first connecting elements is formed as a plug.

7. The semiconductor module system as claimed in claim 1, wherein the first ends of the electrically conductive first connecting elements are arranged along opposite sides of the substrate.

8. A semiconductor module comprising:
a substrate having a bottom side and a top side spaced apart from the bottom side in a vertical direction;
at least one semiconductor chip arranged on the top side;
a number of at least two electrically conductive first connecting elements having a first end and a second end, wherein a first end of each one of the electrically conductive first connecting elements is freely accessible and protrudes away from an insulation carrier of the substrate in a direction perpendicular to the vertical direction;
a connecting system comprising a number of N≥1 connectors;
wherein one of the N connectors comprises at least two electrically conductive second connecting elements, each one of the electrically conductive second connecting elements having a first end and a second end;
wherein the second end of one of the electrically conductive second connecting elements is electrically conductively connectable to an external device; and
wherein the first end of each one of the electrically conductive first connecting elements is electrically conductively connected to the first end of one of the electrically conductive second connecting elements.

9. The semiconductor module of claim 8, wherein at least one of the electrically conductive first connecting elements forms a press-fit connection with one of the second connecting elements.

10. The semiconductor module of claim 8, wherein at least one of the first ends of the electrically conductive second connecting elements is formed as a contact spring.

11. The semiconductor module of claim 8, wherein at least one of the first ends of the electrically conductive first connecting elements is connected to the first end of one of electrically conductive second connecting elements by a locking bar or a rivet.

12. The semiconductor module of claim 8, wherein at least one of the first ends of the electrically conductive first connecting elements is soldered or welded to the first end of one of the second connecting elements.

13. The semiconductor module of claim 8, wherein the one of the N connectors comprises a dielectric mounting fastening the second connecting elements.

14. The semiconductor module of claim 13, wherein the electrically conductive second connecting elements are inserted and/or molded in the dielectric mounting.

15. The semiconductor module of claim 13, wherein:
the dielectric mounting has a lower side and an upper side spaced apart from the lower side in the vertical direction; and wherein
the second end of each one of the electrically conductive second connecting elements is accessible at the upper side.

16. The semiconductor module of claim 8, wherein the connecting system comprises a frame which surrounds the semiconductor chip and which is formed partly or completely by the number of N≥1 connectors.

17. The semiconductor module of claim 8, wherein the substrate comprises a top metallization layer arranged on the insulation carrier.

18. The semiconductor module of claim 17, wherein the semiconductor chip is arranged on that side of the top metallization layer facing away from the insulation carrier.

19. The semiconductor module of claim 17, wherein an insulation layer is arranged between the top metallization layer and the electrically conductive first connecting elements.

20. The semiconductor module system as claimed in claim 8, wherein the first ends of the electrically conductive first connecting elements are arranged along opposite sides of the substrate.

21. A method for producing a semiconductor module comprising:
  providing a substrate arrangement comprising:
    a substrate having a bottom side and a top side spaced apart from the bottom side in a vertical direction;
    at least one semiconductor chip arranged on the top side;
    a number of at least two electrically conductive first connecting elements having a first end and a second end, wherein a first end of each one of the electrically conductive first connecting elements is freely accessible and protrudes away from an insulation carrier of the substrate in a direction perpendicular to the vertical direction;
  providing a connecting system comprising a number of N≥1 connectors, wherein one of the N connectors comprises at least two electrically conductive second connecting elements and each one of the electrically conductive second connecting elements has a first end and a second end, wherein the second end of one of the electrically conductive second connecting elements is electrically conductively connectable to an external device; and
  electrically conductively connecting the first end of each one of the electrically conductive first connecting elements to the first end of one of the electrically conductive second connecting elements.

22. The method of claim 21, wherein each one of the first ends of the electrically conductive second connecting elements is plugged into the first end of one of the electrically conductive first connecting elements.

23. The method of claim 21, wherein during the step of plugging, each one of the N connectors is pushed toward the substrate arrangement in a direction perpendicular to the vertical direction.

24. The method of claim 21, wherein the first ends of the electrically conductive first connecting elements are arranged along opposite sides of the substrate.

* * * * *